(12) United States Patent
Phillips, III et al.

(10) Patent No.: US 8,075,140 B2
(45) Date of Patent: Dec. 13, 2011

(54) LED ILLUMINATION SYSTEM WITH POLARIZATION RECYCLING

(75) Inventors: William E. Phillips, III, Cincinnati, OH (US); Ronald E. English, Jr., Cincinnati, OH (US); Patrick R. Destain, Allen, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 926 days.

(21) Appl. No.: 11/772,609

(22) Filed: Jul. 2, 2007

(65) Prior Publication Data

US 2009/0116214 A1 May 7, 2009

Related U.S. Application Data

(60) Provisional application No. 60/820,894, filed on Jul. 31, 2006, provisional application No. 60/820,887, filed on Jul. 31, 2006.

(51) Int. Cl.
*G03B 21/14* (2006.01)
*F21V 7/04* (2006.01)

(52) U.S. Cl. ............................ 353/20; 353/37; 362/341

(58) Field of Classification Search .................. 353/20, 353/37, 38; 362/341; 359/483, 641, 742
See application file for complete search history.

(56) References Cited

U.S. PATENT DOCUMENTS

| | | | |
|---|---|---|---|
| 5,022,750 A | 6/1991 | Flasck | |
| 5,084,807 A | 1/1992 | McKechnie et al. | |
| 5,108,172 A | 4/1992 | Flasck | |
| 5,335,158 A | 8/1994 | Kaplan et al. | |
| 5,349,509 A | 9/1994 | Klug | |
| 5,592,578 A | 1/1997 | Ruh | |
| 5,625,738 A | 4/1997 | Magarill | |
| 5,738,429 A | 4/1998 | Tagawa | |
| 5,882,774 A | 3/1999 | Jonza et al. | |
| 5,962,114 A | 10/1999 | Jonza et al. | |
| 6,050,690 A | 4/2000 | Shaffer et al. | |
| 6,091,085 A | 7/2000 | Lester | |
| 6,188,460 B1 * | 2/2001 | Faris | ............................ 349/176 |
| 6,200,002 B1 | 3/2001 | Marshall et al. | |

(Continued)

FOREIGN PATENT DOCUMENTS

AU 2005/200510 2/2005

(Continued)

OTHER PUBLICATIONS

Hoelen, C. et al., "Multi-chip color variable LED spot modules", Proceedings of the SPIE, SPIR, Bellingham, VA, US, vol. 5941, Aug. 2, 2005, pp. 59410A-1.

(Continued)

*Primary Examiner* — John R Lee
(74) *Attorney, Agent, or Firm* — Kristofor L. Storvick

(57) ABSTRACT

A light engine has a light source front surface that emits non-collimated light. A collection lens collects the non-collimated light and provides incompletely collimated light. A collimating lens receives the incompletely collimated light and provides a collimated image. A non-orthogonal polarizing filter receives the collimated image and passes a polarized portion of the collimated image as a direct component of the polarized light engine image. The non-orthogonal polarizing filter reflects a recycled image back to the front surface. The non-orthogonal shape of the polarizing filter is selected according to the pattern of light on the light source front surface.

22 Claims, 11 Drawing Sheets

U.S. PATENT DOCUMENTS

| | | |
|---|---|---|
| 6,204,523 B1 | 3/2001 | Carey et al. |
| 6,246,446 B1 | 6/2001 | Heimbuch et al. |
| 6,260,973 B1 | 7/2001 | Minato |
| 6,328,447 B1 | 12/2001 | Yamazaki et al. |
| 6,337,536 B1 | 1/2002 | Matsubara et al. |
| 6,485,147 B2 | 11/2002 | Liang |
| 6,486,499 B1 | 11/2002 | Krames et al. |
| 6,520,643 B1 | 2/2003 | Holman |
| 6,527,411 B1 | 3/2003 | Sayers |
| 6,590,235 B2 | 7/2003 | Carey et al. |
| 6,609,795 B2 | 8/2003 | Weber et al. |
| 6,639,706 B2 | 10/2003 | Ziv |
| 6,719,426 B2 | 4/2004 | Magarill et al. |
| 6,721,096 B2 | 4/2004 | Bruzzone et al. |
| 6,729,730 B2 * | 5/2004 | Ito .................................. 353/20 |
| 6,772,265 B2 | 8/2004 | Baweja et al. |
| 6,791,749 B2 | 9/2004 | DelPico et al. |
| 6,793,344 B2 | 9/2004 | Kwok et al. |
| 6,830,345 B2 | 12/2004 | Kamm et al. |
| 6,856,466 B2 | 2/2005 | Tocci |
| 6,869,206 B2 * | 3/2005 | Zimmerman et al. ........ 362/310 |
| 6,961,190 B1 | 11/2005 | Tamaoki et al. |
| 6,981,642 B2 | 1/2006 | Krichever |
| 7,046,338 B2 | 5/2006 | McGuire |
| 7,059,728 B2 | 6/2006 | Alasaarela et al. |
| 7,072,096 B2 | 7/2006 | Holman et al. |
| 7,101,050 B2 | 9/2006 | Magarill et al. |
| 7,133,211 B2 | 11/2006 | Kwok |
| 7,168,820 B1 | 1/2007 | Minassian |
| 7,215,882 B2 | 5/2007 | Cho et al. |
| 7,280,288 B2 | 10/2007 | Loh et al. |
| 7,287,861 B2 | 10/2007 | Nakayama |
| 7,300,177 B2 * | 11/2007 | Conner ........................ 362/244 |
| 7,352,124 B2 | 4/2008 | Beeson |
| 7,445,340 B2 * | 11/2008 | Conner et al. .................. 353/20 |
| 7,473,013 B2 | 1/2009 | Shimada |
| 7,479,662 B2 | 1/2009 | Soules et al. |
| 7,540,616 B2 * | 6/2009 | Conner ........................ 353/20 |
| 7,717,589 B2 | 5/2010 | Nishioka et al. |
| 7,901,083 B2 | 3/2011 | Destain |
| 2002/0024640 A1 | 2/2002 | Ioka |
| 2002/0057057 A1 | 5/2002 | Sorg |
| 2002/0080622 A1 | 6/2002 | Pashley et al. |
| 2002/0125324 A1 | 9/2002 | Yavid |
| 2002/0126363 A1 | 9/2002 | Ziv |
| 2002/0139984 A1 | 10/2002 | Sugawara et al. |
| 2002/0176015 A1 | 11/2002 | Lichtfuss |
| 2002/0180107 A1 | 12/2002 | Jackson et al. |
| 2002/0180933 A1 * | 12/2002 | Ito .................................. 353/20 |
| 2002/0190406 A1 | 12/2002 | Merrill et al. |
| 2003/0048423 A1 | 3/2003 | Aastuen et al. |
| 2003/0117595 A1 | 6/2003 | Li |
| 2003/0147055 A1 | 8/2003 | Yokoyama |
| 2003/0231497 A1 | 12/2003 | Sakata et al. |
| 2004/0099992 A1 | 5/2004 | Merrill et al. |
| 2004/0099993 A1 | 5/2004 | Jackson et al. |
| 2004/0140765 A1 | 7/2004 | Takekuma |
| 2004/0150997 A1 * | 8/2004 | Ouderkirk et al. ............ 362/255 |
| 2004/0174500 A1 * | 9/2004 | Ito .................................. 353/20 |
| 2004/0196518 A1 | 10/2004 | Wine et al. |
| 2004/0218387 A1 | 11/2004 | Gerlach |
| 2004/0227898 A1 | 11/2004 | Ma et al. |
| 2004/0264185 A1 | 12/2004 | Grotsch et al. |
| 2005/0001999 A1 | 1/2005 | Eguchi |
| 2005/0006658 A1 | 1/2005 | Ho |
| 2005/0023545 A1 | 2/2005 | Camras et al. |
| 2005/0036119 A1 | 2/2005 | Ruda |
| 2005/0117366 A1 | 6/2005 | Simbal |
| 2005/0135113 A1 | 6/2005 | Wang et al. |
| 2005/0174771 A1 | 8/2005 | Conner |
| 2005/0179041 A1 | 8/2005 | Harbers et al. |
| 2005/0185419 A1 * | 8/2005 | Holman et al. ............... 362/561 |
| 2005/0206770 A1 | 9/2005 | Nathanson |
| 2005/0213057 A1 | 9/2005 | Nakayama |
| 2005/0269587 A1 | 12/2005 | Loh |
| 2005/0269591 A1 | 12/2005 | Hsin Chen |
| 2006/0007538 A1 | 1/2006 | Robinson |
| 2006/0012299 A1 | 1/2006 | Suehiro et al. |
| 2006/0022210 A1 | 2/2006 | Streubel |
| 2006/0034082 A1 | 2/2006 | Park |
| 2006/0039140 A1 | 2/2006 | Magarill |
| 2006/0055838 A1 * | 3/2006 | Mi et al. ........................ 349/30 |
| 2006/0066192 A1 | 3/2006 | Beeson |
| 2006/0082560 A1 | 4/2006 | Greer et al. |
| 2006/0083000 A1 | 4/2006 | Yoon et al. |
| 2006/0091411 A1 | 5/2006 | Ouderkirk et al. |
| 2006/0091784 A1 | 5/2006 | Conner et al. |
| 2006/0091798 A1 | 5/2006 | Ouderkirk et al. |
| 2006/0092532 A1 | 5/2006 | Ouderkirk et al. |
| 2006/0102914 A1 | 5/2006 | Smits et al. |
| 2006/0124918 A1 | 6/2006 | Miller et al. |
| 2006/0139575 A1 | 6/2006 | Alasaarela |
| 2006/0139580 A1 | 6/2006 | Conner |
| 2006/0158887 A1 | 7/2006 | Holder |
| 2006/0163590 A1 | 7/2006 | Erchak et al. |
| 2006/0221305 A1 | 10/2006 | Magarill |
| 2006/0232578 A1 | 10/2006 | Reinhorn |
| 2006/0262282 A1 | 11/2006 | Magarill |
| 2006/0262514 A1 | 11/2006 | Conner et al. |
| 2007/0016199 A1 | 1/2007 | Boehm, Jr. et al. |
| 2007/0023941 A1 | 2/2007 | Duncan et al. |
| 2007/0024981 A1 | 2/2007 | Duncan et al. |
| 2007/0030456 A1 | 2/2007 | Duncan et al. |
| 2007/0063647 A1 | 3/2007 | Yu |
| 2007/0085973 A1 | 4/2007 | Duncan et al. |
| 2007/0103648 A1 * | 5/2007 | Kojima ........................ 353/81 |
| 2007/0146639 A1 * | 6/2007 | Conner ........................ 353/20 |
| 2007/0152231 A1 | 7/2007 | Destain |
| 2007/0153397 A1 | 7/2007 | Destain |
| 2007/0153402 A1 | 7/2007 | Destain |
| 2007/0188864 A1 | 8/2007 | Duncan et al. |
| 2007/0191506 A1 | 8/2007 | Lu et al. |
| 2007/0296921 A1 * | 12/2007 | Wang et al. ..................... 353/20 |
| 2007/0297052 A1 * | 12/2007 | Wang et al. ..................... 359/486 |
| 2008/0051135 A1 | 2/2008 | Destain |
| 2008/0231780 A1 * | 9/2008 | Graf et al. ..................... 349/112 |
| 2008/0231953 A1 * | 9/2008 | Young ........................ 359/495 |
| 2009/0116214 A1 * | 5/2009 | Phillips et al. ................. 362/84 |
| 2009/0128781 A1 * | 5/2009 | Li .................................. 353/20 |
| 2009/0141250 A1 * | 6/2009 | Destain ........................ 353/69 |
| 2009/0295265 A1 | 12/2009 | Tabuchi et al. |
| 2009/0310042 A1 * | 12/2009 | Vidal et al. ........................ 349/8 |

FOREIGN PATENT DOCUMENTS

| | | |
|---|---|---|
| EP | 0 557 776 | 2/1993 |
| EP | 0 763 763 | 3/1997 |
| EP | 1363335 | 11/2003 |
| EP | 1 389 018 | 2/2004 |
| EP | 1387211 | 2/2004 |
| GB | 2 383 428 | 6/2003 |
| GB | 2 413 858 | 11/2005 |
| JP | 2003-044839 | 2/2003 |
| JP | 2006/067469 | 3/2007 |
| KR | 2005/065919 | 6/2005 |
| WO | WO 00/65664 | 2/2000 |
| WO | WO 02/102087 | 12/2002 |
| WO | WO 03/098916 | 11/2003 |
| WO | WO 2004/068602 | 8/2004 |
| WO | WO 2004/084534 | 9/2004 |
| WO | WO 2005/077002 | 8/2005 |
| WO | WO 2005/078496 | 8/2005 |
| WO | WO 2005/083804 | 9/2005 |
| WO | WO 2005/107420 | 11/2005 |
| WO | WO 2005/119707 | 12/2005 |
| WO | WO 2006/033032 | 3/2006 |
| WO | WO 2006/033245 | 3/2006 |
| WO | WO 2006/036627 | 4/2006 |
| WO | WO 2006/061763 | 6/2006 |
| WO | WO 2006/067469 | 6/2006 |
| WO | WO 2006/124993 | 11/2006 |
| WO | WO 2007/016199 | 2/2007 |
| WO | WO 2007/042711 | 4/2007 |

OTHER PUBLICATIONS

U.S. Appl. No. 60/820,894, filed Jul. 31, 2006.

U.S. Appl. No. 60/820,877, filed Jul. 31, 2006.

U.S. Appl. No. 60/820,883, filed Jul. 31, 2006.
U.S. Appl. No. 60/820,887, filed Jul. 31, 2006.
U.S. Appl. No. 60/820,888, filed Jul. 31, 2006.
U.S. Appl. No. 60/821,032, filed Aug. 1, 2006.
U.S. Appl. No. 60/838,988, filed Aug. 21, 2006.
U.S. Appl. No. 11/381,518, filed May 3, 2006.
U.S. Appl. No. 11/457,599, filed Jul. 14, 2006.
U.S. Appl. No. 11/772,609, filed Jul. 2, 2007.
U.S. Appl. No. 11/831,220, filed Jul. 31, 2007.
U.S. Appl. No. 11/831,307, filed Jul. 31, 2007.
U.S. Appl. No. 11/831,171, filed Jul. 31, 2007.
U.S. Appl. No. 11/831,198, filed Jul. 31, 2007.
U.S. Appl. No. 11/831,263, filed Jul. 31, 2007.
Data Management White Papers, silicon.com, http://whitepapers.silicon.com/0,39024759,60243129p-39000676g.00.htm, downloaded Jul. 13, 2007.
Destain, Patrick: Opcon Associates Inc., Description of the Mini-projection Optical design, Jan. 23, 2006.
DigiTimes daliy IT news, TI shows projection Image for mobile phone, http://www.digitimes.com/NewsShow/MailHome.asp?datePublish=2007/3/27&pages=VL&seq=207, Mar. 28, 2007.
Zou, Hans et al.; 58.1: Single-Panel LCOS Color Projector with LED Light Sources, SID 05 Digest, pp. 1698-1701, 2005.
Lo, H. et al.; P-208: Novel Optical Design for Mini-Projector, SID 06 Digest, pp. 1012-1014, 2006.
"TI Pushing DLP into Mobile Phase" http://www.dailytech.com/article.aspx?newsid=5671, (download date: Oct. 25, 2007).
"Digismart Miniature Projection Technology" http://www.digislide.com.au/consumer/digismart.htm, (download date: Oct. 27, 2007).
Murat et al., "Design of new collection systems for multi LED light engines," Proc. of SPIE vol. 6196 619604-1, Apr. 21, 2006.
Search Report for International Publication No. PCT/US2008/074823, 3 pages, Jan. 2008.
Written Opinion for International Publication No. PCT/US2008/074823, 3 pages, Jan. 2008.
Riehman et al. "Ultrakompakte Projekionskopfe fur die optische Messtechnik auf der Basis von OLED-Displays", DGaO-Proceedings 2004.

* cited by examiner

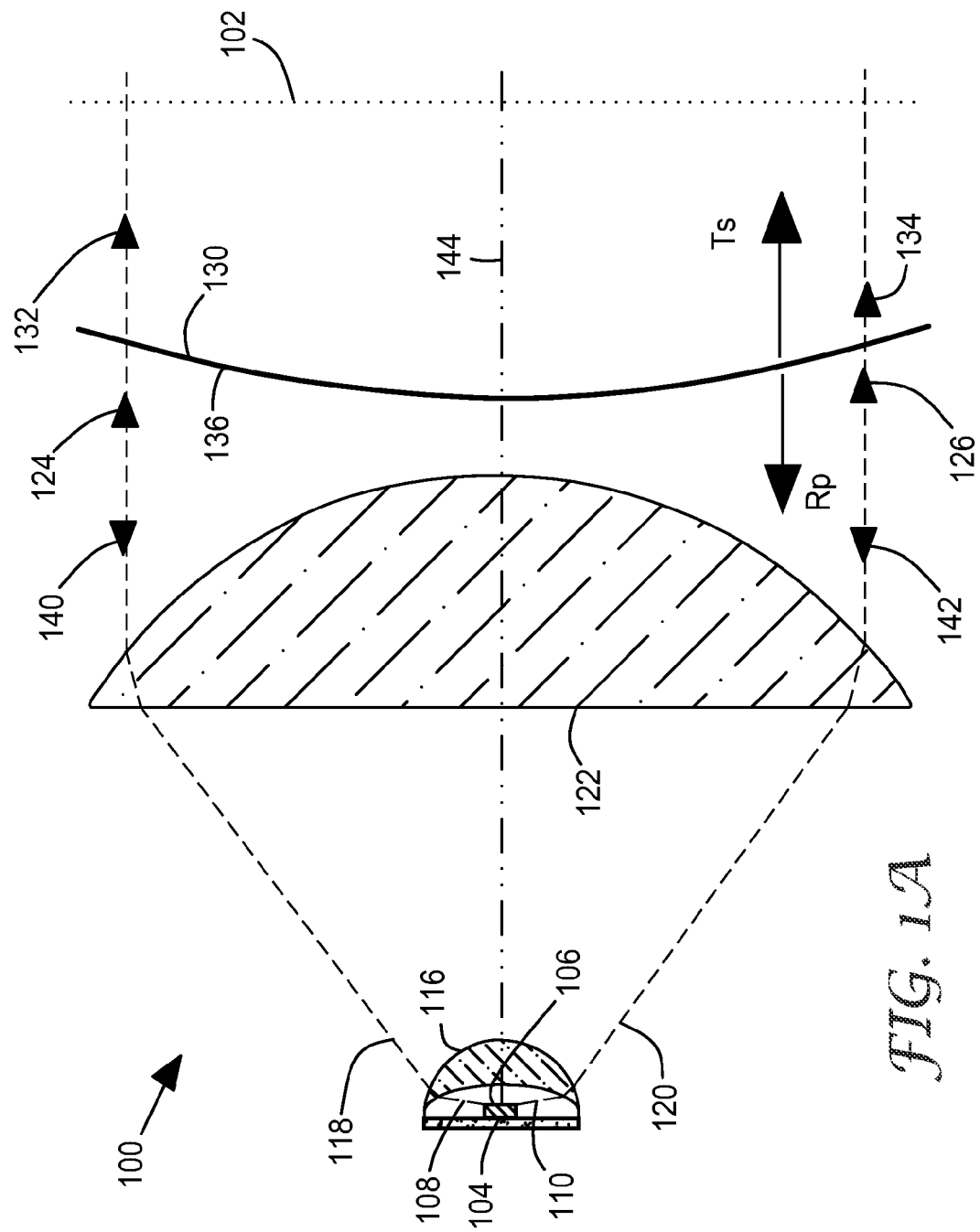

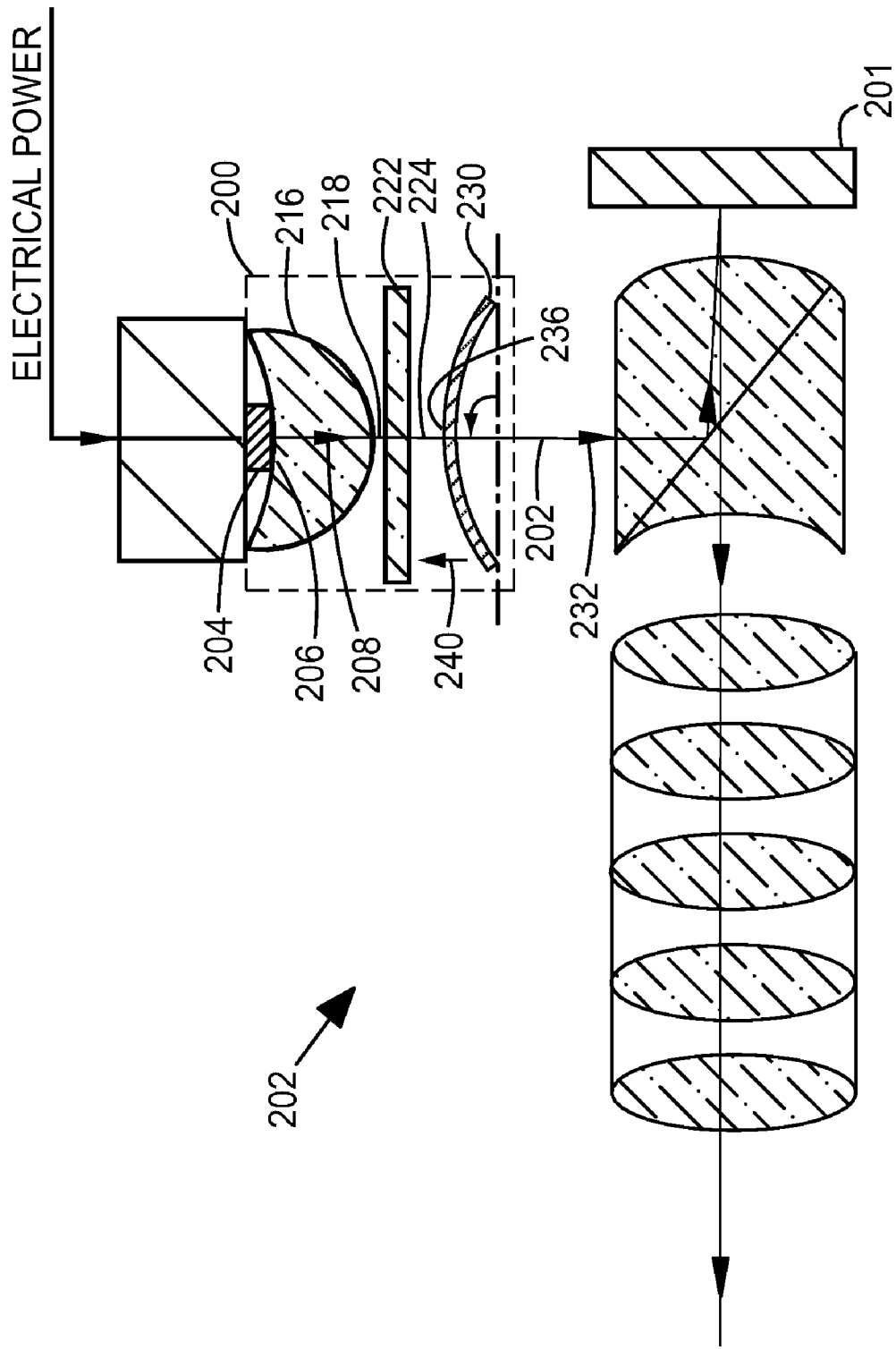

| Units | Coated Film | Uncoated Film |
|---|---|---|
| With Film | 1.61 mW/cm$^2$ | 1.52 mW/cm$^2$ |
| Without Film | 1.40 mW/cm$^2$ | 1.41 mW/cm$^2$ |
| Increase | 15% | 7.8% |

| | ¼ λ + APF | No Recycling | % Increase |
|---|---|---|---|
| Green | 5.5 lm | 4.43 lm | 24.2% |
| White | 17.42 lm | 16.2 lm | 7.5% |

| Volts | Current | Watts In | APF + 1/4 λ Out (lm) | No APF + 1/4 λ Out (lm) | Recycling Efficiency |
|---|---|---|---|---|---|
| 3.1 | 0.2 A | 0.62 W | 2.16 | 1.87 | 15.4% |
| 3.3 | 0.35 A | 1.15 W | 3.21 | 2.82 | 14% |

LED ILLUMINATION SYSTEM WITH POLARIZATION RECYCLING

CROSS-REFERENCE TO RELATED APPLICATION

The present application is based on and claims the benefit of U.S. provisional patent application Ser. No. 60/820,894, filed Jul. 31, 2006, the content of which is hereby incorporated by reference in its entirety; and U.S. Provisional patent application 60/820,887, filed Jul. 31, 2006, the content of which is hereby incorporated by reference in its entirety.

BACKGROUND

Optical projectors are used to project images onto surfaces for viewing by groups of people. Optical projectors include optical projector subsystems that include lenses, filters, polarizers, light sources, image forming devices and the like. There is a desire to improve optical efficiency, however existing light engines limit efforts to improve optical efficiency. A method and optical projection subsystem are needed that provide enhanced efficiency.

SUMMARY

Disclosed is a light engine. The light engine provides a polarized light engine image.

The light engine comprises a light source that has a front surface. The front surface includes a first region that emits non-collimated light and a second region that recycles light. The light engine comprises a collection lens. The collection lens collects the non-collimated light and provides incompletely collimated light from the front surface. The light engine comprises a collimating lens. The collimating lens receives the incompletely collimated light and provides a collimated image of the front surface.

The light engine comprises a polarizing filter. The polarizing filter receives the collimated image of the front surface. The polarizing filter is aligned non-orthogonally with respect to an optical axis of the light engine. The polarizing filter passes a polarized portion of the collimated image as a direct component of the polarized light engine image. The polarizing filter reflects a recycled image back to the front surface. The front surface provides the recycled image as a recycled component of the polarized light engine output.

According to one aspect, the non-orthogonal polarizing filter comprises a curved filter shape having a curvature that shifts portions of the recycled component relative to the direct component, to increase brightness uniformity of the polarized light engine image. According to another aspect, the first region includes a light emitting diode that emits a pattern of optical brightness that is off-center relative to a light emitting diode center, and the non orthogonal polarizing filter is tilted to improve the direction of the recycled image onto the front surface.

BRIEF DESCRIPTION OF THE DRAWINGS

FIG. 1A illustrates a light engine that includes a curved polarizing filter.

FIG. 2A illustrates a projector that includes a light engine with a curved polarizing filter.

DETAILED DESCRIPTION

In the embodiments described below, a light engine has a light source front surface that emits non-collimated light. A collection lens collects the non-collimated light and provides incompletely collimated light. A collimating lens receives the incompletely collimated light and provides a substantially collimated beam. A non-orthogonal polarizing filter receives the collimated image and passes a polarized portion of the collimated image as a direct component of a polarized light engine image. The polarizing filter reflects a recycled image back to the front surface. The front surface provides a recycled light component of the light engine image. The front surface can provide recycled light by reflection or by phosphorescence, or both. The efficiency of the light engine is increased by the light recycling. The non-orthogonal polarizing filter has a non-orthogonal reflective surface that shifts a position of the recycled component relative to the direct component, resulting in increased uniformity of the light engine image. The shift in position compensates for non uniformities of emission from the front surface of the light source, or for imperfections in the collimation of the light.

Polarization recycling is very useful for applications that need polarized light from a non-polarized source, such as a light emitting diode (LED). These applications include projection systems that use transmissive liquid crystal display (LCD) or reflective liquid crystal on silicon (LCOS) microdisplays or other types of digital imaging devices.

Use of reflective polarizers integrated into LED light sources has been previously described in WO 2004/068602 (Ouderkirk et al.). Disclosed in this application is use of non-orthogonal reflective polarizers with collimated light to induce polarization recycling. In the current invention, light from an LED passes through and is distributed across a larger area of polarization film, reducing the intensity on the polarization film, and reducing film lifetime effects associated with LED light in a blue part of the spectrum, which is an advantage over previous systems. Also, much or all of the light impinges the polarizer at normal or near-normal incidence, resulting in higher collection efficiency in the recycling.

Figure 1B:
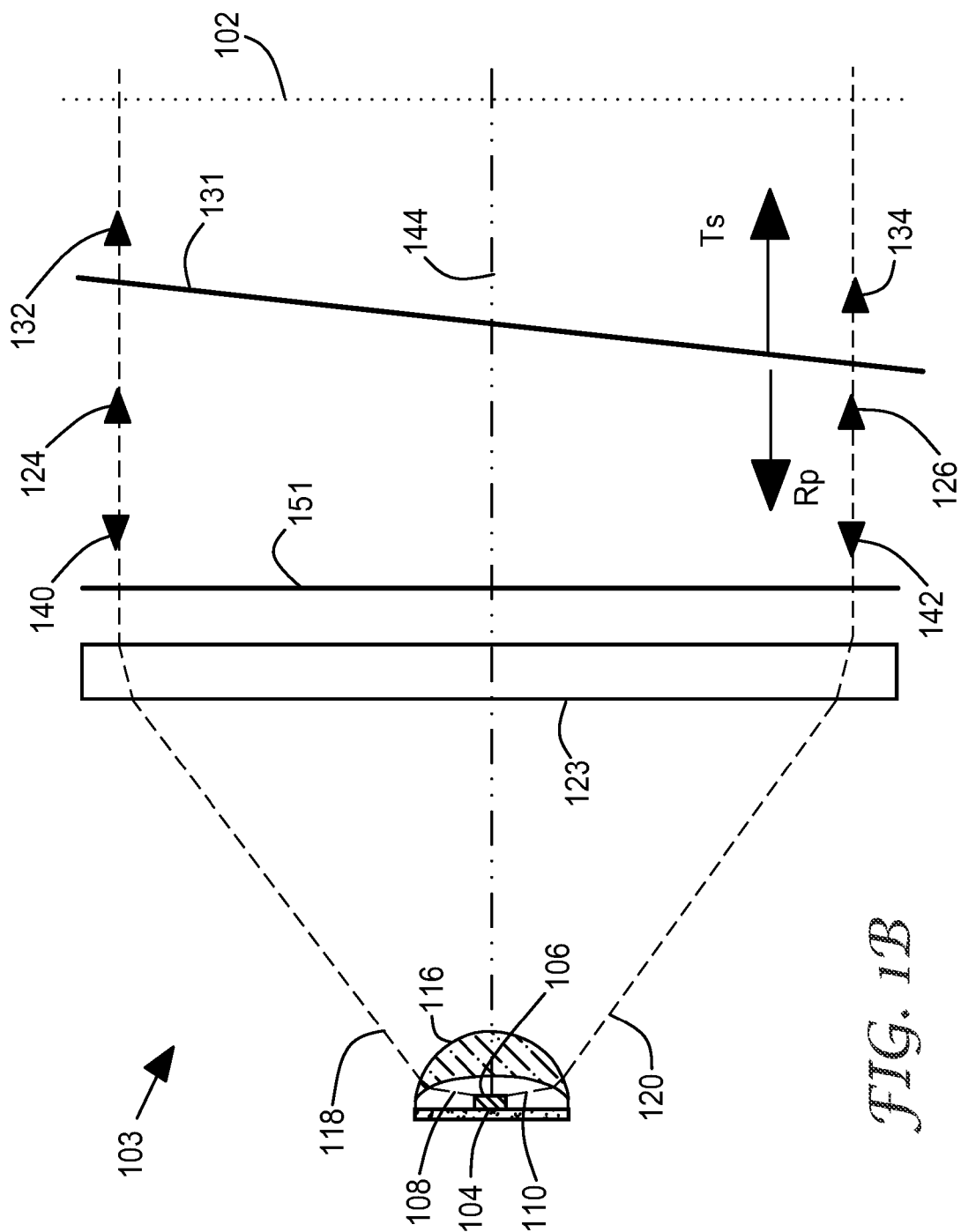
FIG. 1B illustrates a light engine that includes a tilted polarizing filter.

The recycling reflective polarizer is placed non-orthogonally along the optical axis after a collimating element, as shown in FIGS. 1A, 1B. At this location, the rejected or "blocked" polarization state is reflected back along the emission path to the LED die, which may or may not be coated with a phosphor. This light is then reflected or reabsorbed. Some of the absorbed light stimulates the phosphor to re-emit.

An LED die coated with phosphor is denoted as a PLED. An example of a PLED is a blue LED illuminating a phosphor that converts blue to both red and green wavelengths. A portion of the blue excitation light is not absorbed by the phosphor, and the residual blue excitation light is combined with the red and green light emitted by the phosphor. Another example of a PLED is an ultraviolet LED illuminating a phosphor that absorbs and converts ultraviolet light to red, green, and blue light. Phosphor materials, typically inorganic in composition and having excitation wavelengths in the 300-450 nanometer range and emission wavelengths in the visible wavelength range, are well known in the art. See, for example, the line of phosphors offered by Phosphor Technology Ltd., Essex, England. Phosphors include rare-earth doped garnets, such as cerium-doped yttrium aluminum garnet (Ce:YAG), rare-earth doped silicates, thiogallates, and other ceramics. The term phosphor as used herein can also include quantum dots and organic fluorescent materials, including fluorescent dyes and pigments. The term phosphor as used herein can also include III-V re-emitting semiconductor constructions such as those described in WO 02/0297902 and US2002/0139984, or II-VI re-emitting semiconductor constructions such as those described in US2006/0124918. The term phosphor as used herein can also include doped semiconductor layers such as described in U.S. Pat. No. 6,337,536 and EP 1363335 A2.

An example of the recycling reflective polarizer is the multilayer optical polarizing film as described in U.S. Pat. No. 5,882,774 (Jonza et al.), where the alternating layers making up the film have refractive indices along a direction perpendicular to the film that are substantially matched, i.e., $\Delta n_z$ between layers is about zero, so that the reflectivity of any given interface in the film for p-polarized light is substantially constant as a function of incidence angle. Such a reflective polarizing film is referred to herein as "APF" film.

Figures 4, 5:
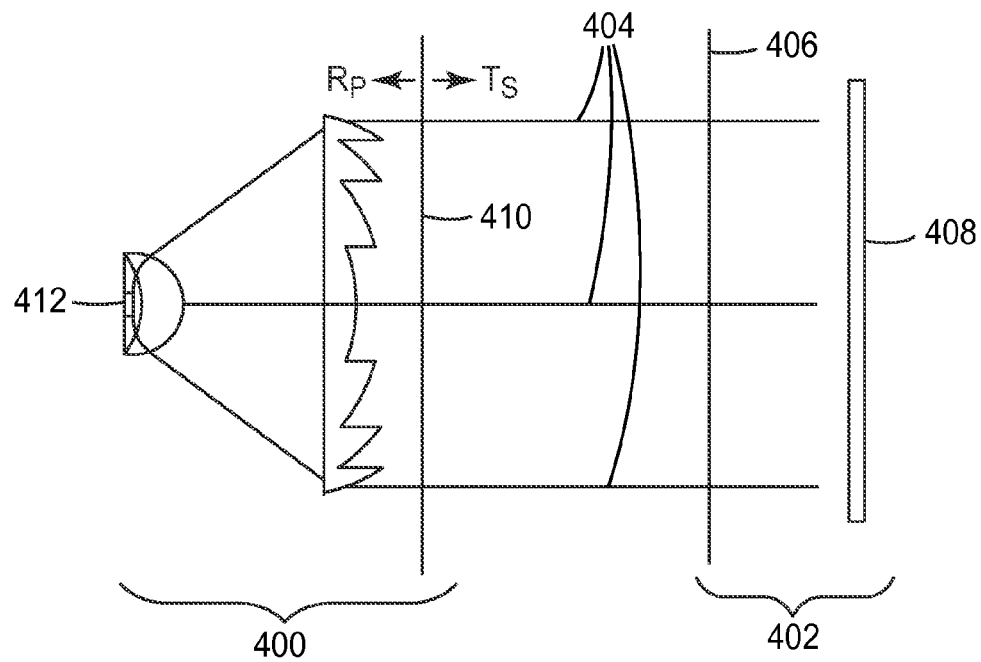
FIG. 4 illustrates a system of measuring light gained by recycling.
FIG. 5 illustrates a table of results using the system in FIG. 4.

Measurements were made with an optical system arranged as shown in FIG. 4. FIG. 4 includes a light engine 400 and a detection system 402 that receives a polarized light engine image 404. The detection system 402 comprises a polarizer 406 and an optical detector 408, such as is available from Newport Corporation, Irvine, Calif. In the light engine 400, a reflective polarizing film 410 was pulled tight to insure a flat reflective surface. A white 1 watt LED 412 (available from Philips Lumileds Lighting Company, 370 West Trimble Road, San Jose, Calif. 95131 USA), having a phosphor coating on the emitting surface of the LED die, was used at a drive current of 0.2 A. The light output was measured with and without the reflective polarizing film 410. The reflecting polarizing film 410 was aligned with polarizer 406 to maximize output. The results are shown in FIG. 5 for uncoated APF film and for APF film coated on both surfaces with anti-reflection layers (standard magnesium fluoride anti-reflection layers were vacuum deposited on the APF film in fashion known by a person of ordinary skill in the art). Using APF film for recycling, increases in light output in the range of 7.8% to 15% were measured.

Figure 6A:
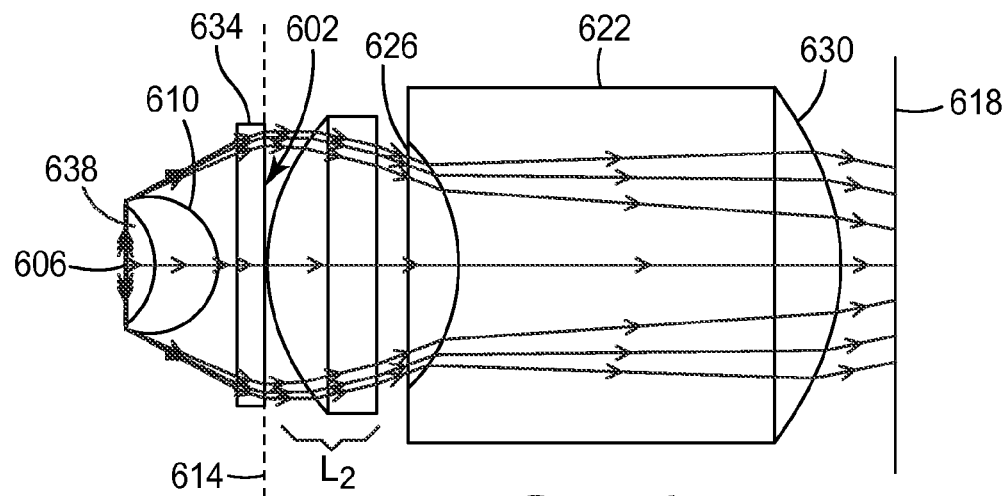
FIGS. 6A, 6B illustrate light engines in projector applications.
Figure 6B:
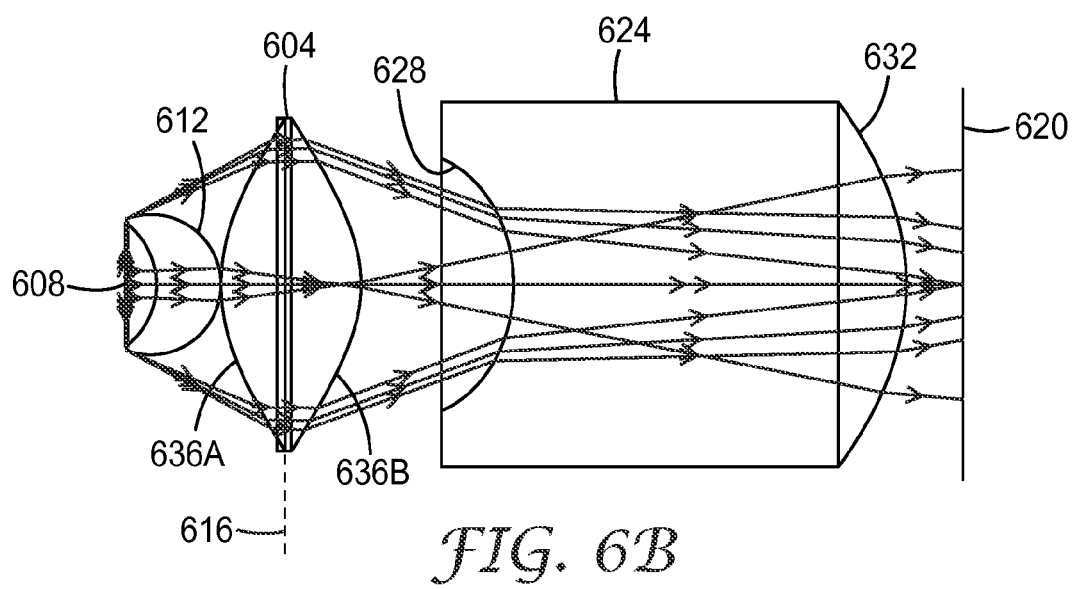

FIGS. 6A and 6B illustrate light engines which can be used in projector applications, the systems both being compatible with the polarization recycling discussed herein. In each case, a reflective polarizing film 602, 604 is preferably positioned at or near the pupil plane 614, 616 (where light is collimated) of the light engine. Each light engine utilizes an LED emitter 606, 608, and collects light from that emitter with a high index ball collection lens 610, 612 and shapes it into a relatively uniform spot that fills a target area 618, 620, at which a digital imaging device such as a liquid crystal on silicon (LCOS) device is positioned. According to one aspect, collection lenses 610, 612 such as disclosed in U.S. application Ser. No. 11/322,801, "LED With Compound Encapsulant Lens", filed Dec. 30, 2005 can be used. These lenses provide a short focal length, small f-number (wide angle) light collection capability. Projection systems in FIGS. 6A, 6B also include a polarizing beam splitter (PBS) 622, 624, the light path of the beamsplitter being shown "unfolded" in the FIGS. 6A, 6B for simplicity. Entrance surfaces 626, 628 and exit surfaces 630, 632 of the PBS 622, 624 can be curved as shown to provide optical power for the illumination system. The system of FIG. 6A uses a Fresnel lens 634 and a plano-convex lens L2 between the ball lens 610 and the PBS 622. The Fresnel lens 634 functions as a collimating lens to provide a collimated image. The system of FIG. 6B uses a double-convex lens, which may be aspheric, and which may be made in two molded halves 636A, 636B. The lens half 636A functions as a collimating lens to provide a collimated image.

Light rays between the curved surfaces of the double-convex lens 636A, 636B in FIG. 6B are substantially collimated. That state of collimation is advantageously used in order to "sandwich" the reflective polarizing film 604 (APF or other) in the middle of the double-convex lens 636A, 636B in order to include optical focusing and polarization recycling features into one element that includes 636A, 636B and 604. The reflective polarizing film 604 can be tilted or curved.

The polarization recycling system illustrated in FIGS. 6A and 6B can also comprise a hollow collection lens, which is disclosed in U.S. provisional patent application 60/820,887. In a hollow collection lens, an LED emitter (such as LED emitter 606) is in air in a hollow cavity (such as hollow cavity 638) in a lens (such as lens 610) that is hemispheric or hyper-hemispheric and positive meniscus and that captures substantially a full hemisphere of light emitted by the LED emitter.

The use of a ball lens 610 (or other collection lens) on top of an LED die allows a large percentage of high angle rays reflected off the die to be recycled. Other recycling mechanisms that do not use a high index ball lens, such as a tapered tunnel or compound parabolic concentrator (CPC) coupled to an LED die, typically lose these high angle rays. In a tapered tunnel such rays that do not meet the total internal reflection (TIR) requirement may pass out the side of the tunnel and be lost.

Figures 8, 9:
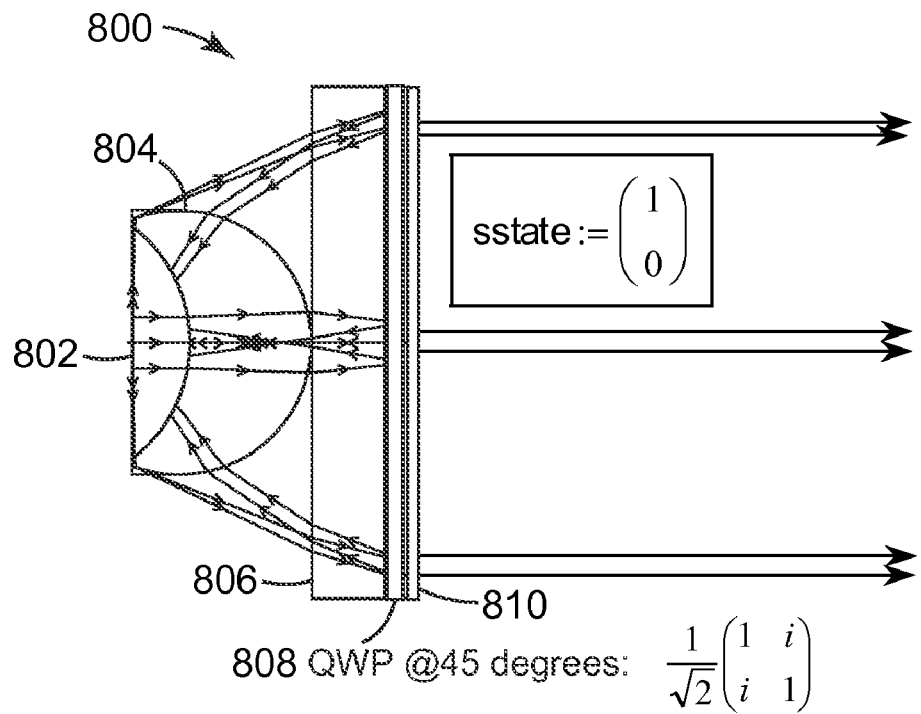
FIG. 8 illustrates a light engine.
FIG. 9 illustrates a table of polarization states.

The disclosed light engine can also be used in a light sequential projector, in which the illumination is in the form of a time sequence of individual primary colors, the time-average of which appears white to the ordinary observer. In this sequential configuration, use of a quarter-wave plate (QWP) to rotate the retro-reflected p-state is preferred. As shown at 800 in FIG. 8, an LED emitter 802 provides light to a collection lens 804. The collection lens 804 provides non-collimated light to a collimating lens 806. A quarter wave plate 808 is disposed between the collection lens 806 and a polarizing filter 810. The polarization recycling is performed in four steps as set forth in FIG. 9. FIG. 9 summarizes the polarization state transformation using the Jones Matrix formalism. The mechanism is that the p-state reflected by the polarization film 810 is rotated after passage through the QWP 808, reflection from the LED emitter die 802, and another passage through the QWP 808. Advantageous for recycling efficiency are strong Fresnel reflections for high angles of incidence at the LED emitter die interfaces. These high incidence angle rays are often discarded in standard non-imaging collector designs such as TIR tapered tunnels.

Figures 10, 11:
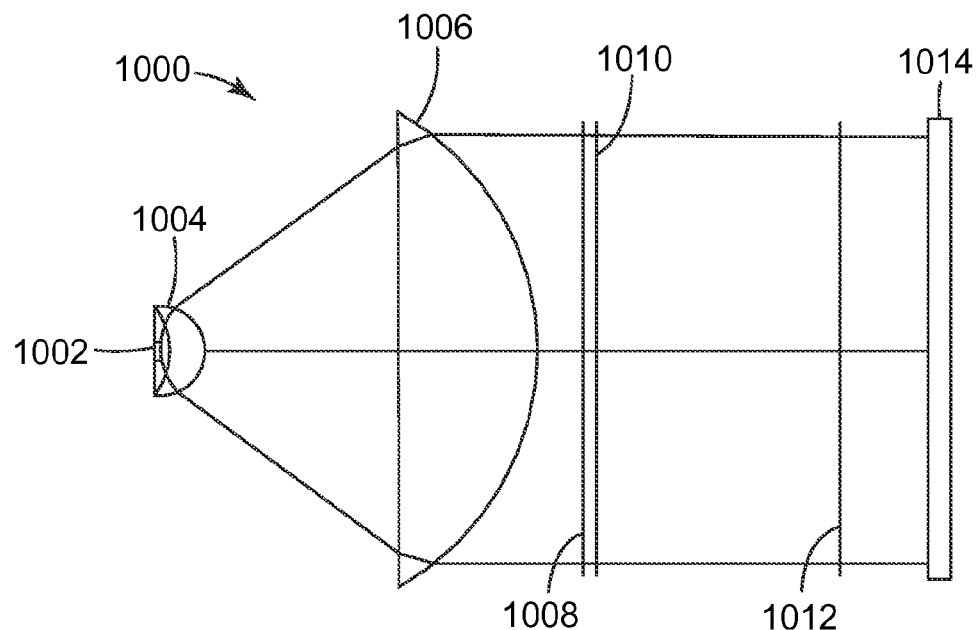
FIG. 10 illustrates a system of measuring light gained by recycling.
FIG. 11 illustrates a table of results using the system in FIG. 10.

The recycling efficiency of an LED illumination system using a collection lens, such as a ball lens with a high index of refraction is measured as shown at 1000 in FIG. 10. In FIG. 10, a light source 1002 couples light to a collection lens 1004. The collection lens 1004 couples light to a collimating lens 1006. The collimating lens 1006 couples light through a quarter wave plate 1008 to a recycling polarizing filter 1010. The arrangement in FIG. 10 tests polarization recycling (similar to FIG. 4). The polarization film preferably comprises an APF film that has anti-reflection coatings on both surfaces. Tests were performed using a white LED (available from Philips Lumileds Lighting Company, 370 West Trimble Road, San Jose, Calif. 95131 USA) having a phosphor coating on the emitting surface of the LED die, and tests were conducted using a green LED (type "Luxeon III", also from available from Philips Lumileds Lighting Company, 370 West Trimble Road, San Jose, Calif. 95131 USA) not having any phosphor coating on the emitting surface of the LED die 1002. The polarized light was directed through a polarizer (analyzer) 1012 and a standard optical detector 1014. The results are provided in the table of FIG. 11. The light output was measured using the polarization film 1010 and quarter wave plate 1008 in place, and then repeated with the quarter wave plate 1008 and polarization film 1010 removed.

Figures 12, 13:
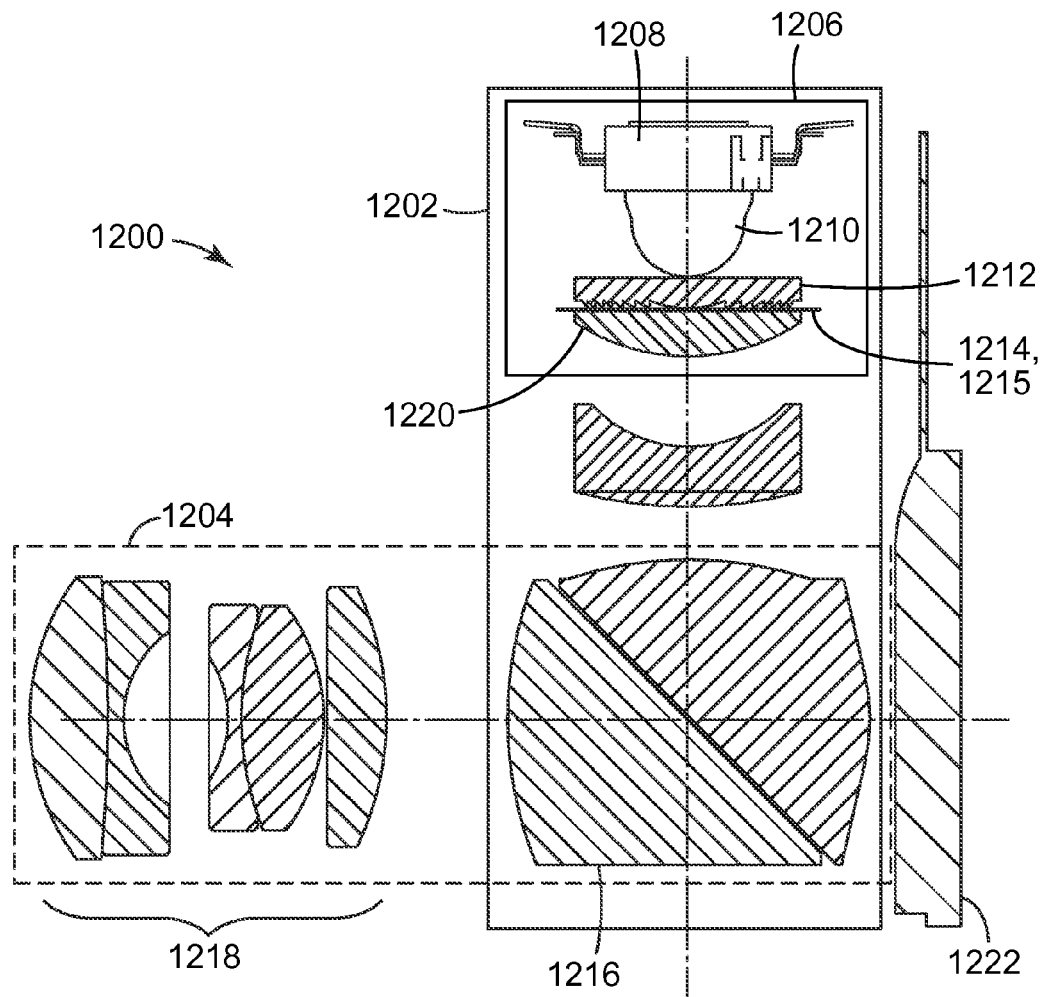
FIG. 12 illustrates a projector used for measuring light gained by recycling.
FIG. 13 illustrates a table of results using the system in FIG. 12.

Further testing was performed using a projector with and without recycling. The projector design shown at 1200 in FIG. 12 was used, where the illumination subsystem 1202 is shown within the solid lines and the projection subsystem 1204 is shown in the (partially overlapping) dashed lines. The light engine 1206 comprises a light source 1208, a collection lens 1210, a collimating lens 1212, a polarizing filter 1214 and a quarter wave plate 1215. The projection subsystem 1204 comprises a polarization beam splitter 1216, and projection lens assembly 1218. The polarizing filter 1214 (which in the current test setup was not tilted or curved) and the quarter-wave film 1215 were secured to a cylindrical lens 1220. An LCOS image forming device 1222 was included in the projector at 1200. The recycling efficiency in this projector system with the Luxeon III Green LED is as shown in the table of FIG. 13.

Figure 1D:
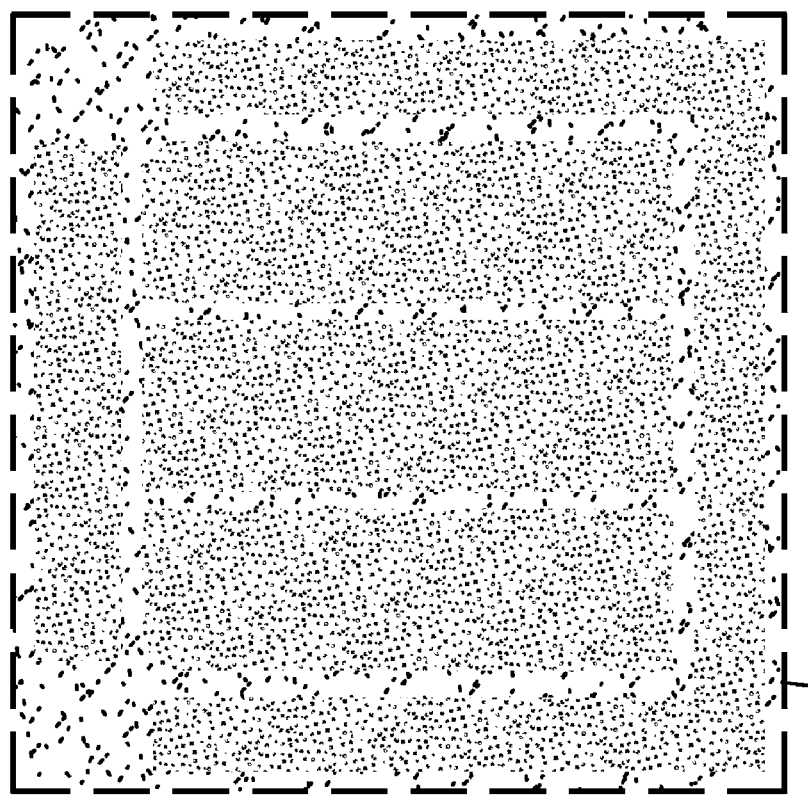
FIG. 1D illustrates a light emission pattern from FIG. 1C, including light recycling.
Figure 1C:
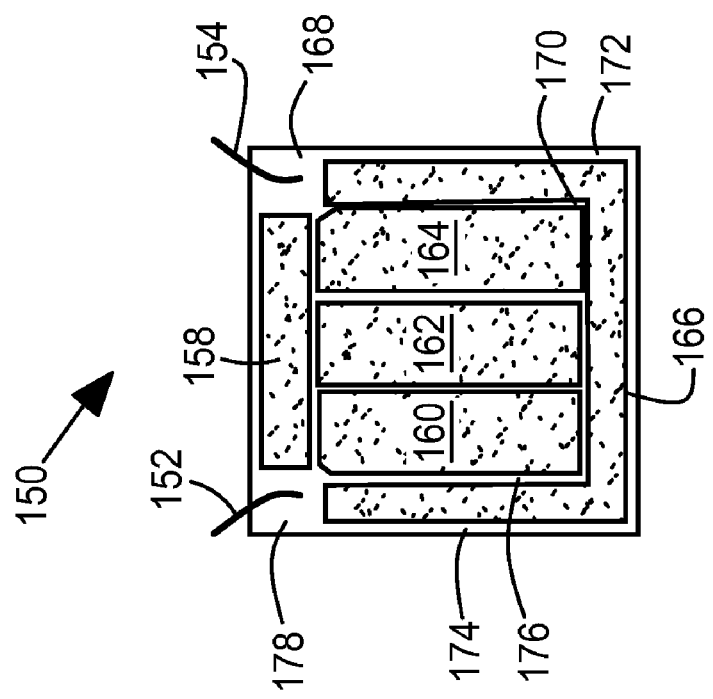
FIG. 1C illustrates a light emitting diode (LED) for use in a light engine.
Figure 14:
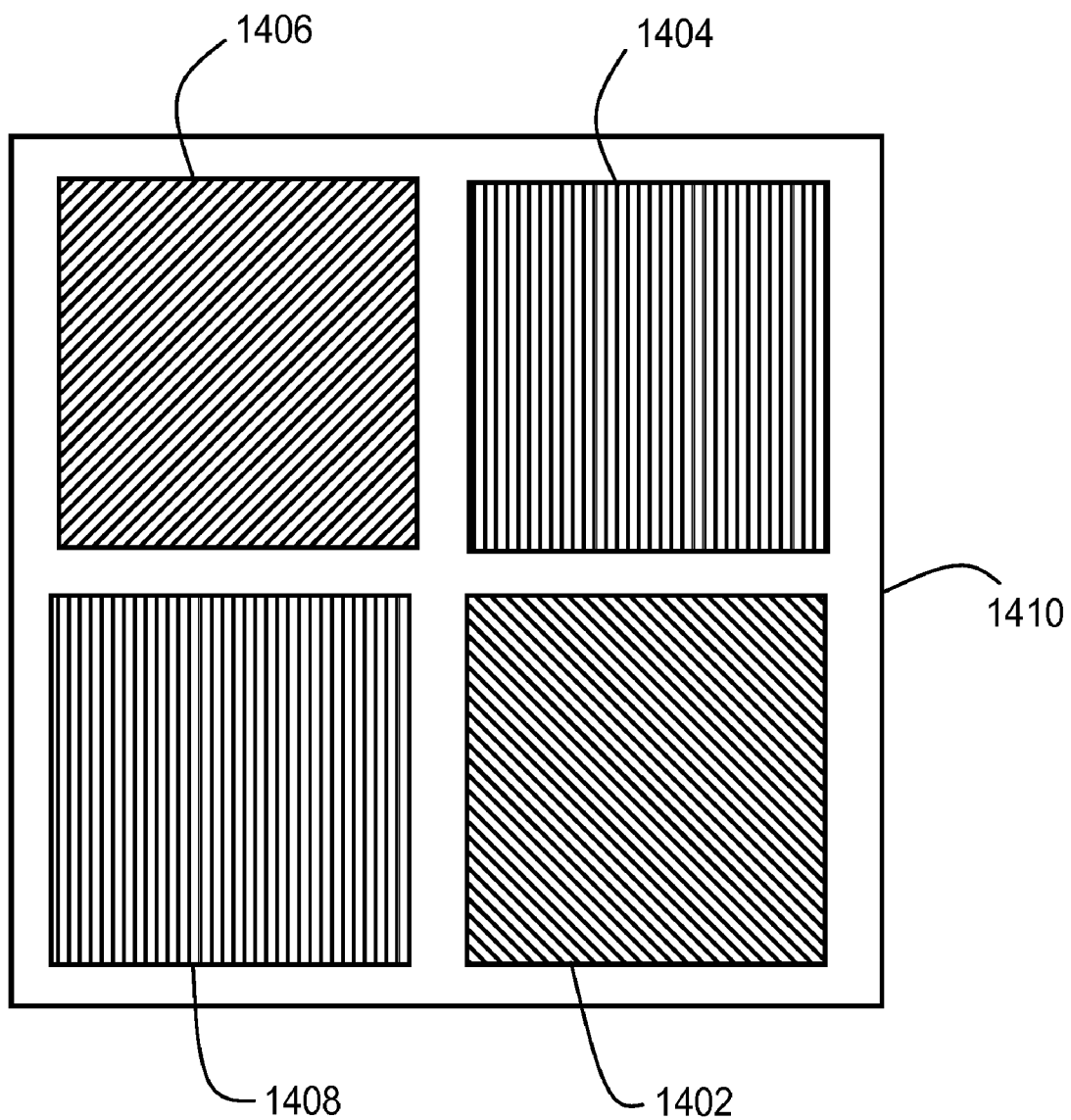
FIG. 14 illustrates a light emitting diode (LED) for use in a light engine.

In some cases a non-orthogonal polarizing filter, such as a curved or tilted polarizing filter may be desirable, according to the pattern of light on the light source front surface. An LED emitter can comprise a plurality of LED dies placed next to each other on a substrate as illustrated in FIG. 1C or FIG. 14. The dies may be rectangular in shape, and there may be, for example, three, four, or more such dies arranged to form the overall emitting surface of the LED emitter. For purposes of the recycling technique, one or more of the LED die rectangles (such as rectangles 158, 160, 162, 164 in FIG. 1C) can be replaced by a mirror surface such as a highly reflective metal or other suitable mirror. For example, where three LED die rectangles of 158, 160, 164 (FIG. 1C) make up the emitter, a center rectangle 162 (FIG. 1C) can be replaced by such a reflective mirror. Then, by slightly tilting or misaligning the reflective polarizing film (such as film 130 in FIG. 1A or film 131 in FIG. 1B) so that the reflective film is non-orthogonal, the reflected polarization state can be directed back to strike the mirrored surface of the central rectangle. This light can eventually turn to the opposite polarization state so that it can be transmitted by the reflective polarizer. Polarization conversion can be done by a variety of methods including a quarter-wave plate attached to the reflective polarizing film, or placing a half-wave mirror as the reflective mirror surface.

FIG. 1A illustrates a light engine 100. The light engine 100 provides a polarized light engine image 102. The image 102 is preferably collimated. The polarized light image 102 can be used, for example, to provide polarized illumination in a projector that utilizes an LCOS image device that has pixels that selectively reflect polarized light.

The light engine 100 comprises a light source 104. The light source 104 has a front surface 106 that includes a first region that emits non-collimated light 108, 110 and a second region that recycles light. The front surface 106 is described in more detail below by way of an example illustrated in FIG. 1C. According to one aspect, the first region comprises an array of light emitting diodes. According to another aspect, the array of light emitting diodes emit white light. According to another aspect, the array of light emitting diodes emit red, green and blue light, either sequentially or simultaneously.

According to one aspect, the first region, the second region or both regions can comprise a phosphor for light recycling. According to another aspect, the first region, the second region or both regions can comprise reflective surfaces for light recycling.

The light engine 100 comprises a collection lens 116. The collection lens 116 collects the non-collimated light 108, 110 and provides incompletely collimated light 118, 120 of the front surface 106. According to one aspect, the collection lens 116 comprises a meniscus lens. According to another aspect, the collection lens 116 comprises a high index of refraction hyperhemispheric ball lens.

The light engine 100 comprises a collimating lens 122. The collimating lens 122 receives the incompletely collimated light 118, 120 and provides a collimated image 124, 126 of the front surface 106. According to one aspect, the collimating lens 122 comprises at least one Fresnel lens. According to another aspect, the collimating lens 122 comprises at least one plano-convex or double convex or meniscus lens. According to one aspect, the light engine image 102 has substantially the same size as the collimated image 124, 126. According to another aspect, the light engine image 102 comprises a collimated image.

The light engine 100 comprises a polarizing filter 130. The polarizing filter 130 receives the collimated image 124, 126 of the front surface 106. The polarizing filter 130 passes a polarized portion 132, 134 of the collimated image 124, 126 as a direct component of the polarized light engine image 102. The polarizing filter 130 reflects a polarized recycled image 140, 142 back to the front surface 106. The front surface 106 returns the recycled image 140, 142 as a recycled component of the polarized light engine output 102. The front surface 106 can return the recycled image 140, 142 by reflection, excitation of phosphors on the front surface 106, or both. According to one aspect, the polarizing filter 130 comprises multilayer optical polarizing film. The polarized, recycled image 140, 142 illuminates the front surface 106 as an autocollimated image. At the front surface 106, the emitted image of the front surface 106 is autocollimated (aligned) with the recycled image 140, 142. The recycled image 140, 142 is a mirror image of the emitted image of the front surface 106.

The polarizing filter 130 comprises a curved filter shape having a curvature that transversely shifts portions of the recycled component relative to the direct component, to increase brightness uniformity of the polarized light engine image 102. The polarizing filter 130 is not orthogonal to the direction of light propagation in the light engine 100. According to one aspect, the curvature is adjusted to correct for aberration in the collection lens and collimating lens. According to another aspect, the curved filter shape comprises a convex face 136 that faces the collimating lens 122. According to another aspect, the first region includes a light emitting diode that emits a pattern of optical brightness that is off-center relative to an optical axis 144, and the polarizing filter 130 is tilted to improve centering of the recycled image 140, 142 onto the front surface 106. According to one aspect, the collection lens 116, the collimating lens 122, the polarizing filter 130, and the polarized light engine image 102 are aligned along a common optical axis 144. According to another aspect, a quarter wave plate (not illustrated in FIG. 1A) is disposed along the optical axis 144 between the light source 104 and the polarizing filter 130. The quarter wave plate rotates the polarization of recycled light so that it will more readily pass through the polarizing filter 130 after recycling. The curvature of the polarizing filter can be on axis or off axis depending on the pattern of brightness of the light emitting diode.

According to one aspect, the polarized light engine image 102 comprises an image of the front surface 106 in which the second regions of the image 102 have been filled by recycled light. According to another aspect, the light engine 100 does not include a light tunnel. Light tunnels for recycling do not provide source images at their outputs, and are less efficient than disclosed imaging recycling systems. An example of a light tunnel is set forth in US Patent Publication 2006/0262514. According to another aspect, the recycled image 140, 142 comprises an autocollimated image relative to the front surface 106. According to another aspect, the light source 104 and the collection lens 116 are portions of a light emitting diode compound encapsulant lens.

FIG. 1B illustrates a light engine 103. Light engine 103 is similar to light engine 100 (FIG. 1A). Reference numbers used in FIG. 1B that are the same as reference numbers used in FIG. 1A identify the same or similar features. Light engine 100 includes a collimating lens 122 that comprises a convex lens, however, light engine 103 includes a collimating lens 123 that comprises one or more Fresnel lenses (as components of collimating lens 123). Light engine 103 includes a polarizing filter 131 that is flat and tilted relative to central optic axis 144. Polarizing filter 131 is not orthogonal to the central optical axis. Light engine 103 includes a quarter wave plate 151. In other respects, light engines 100, 103 are similar. Features shown in FIG. 1A can be adapted for use in FIG. 1B and vice versa.

FIG. 1C illustrates a light emitting diode 150 that serves as an exemplary light source, such as light source 104 in FIGS. 1A, 1B. The light emitting diode 150 is connected to electrical power by way of bond wires 152, 154. The light emitting diode 150 includes light emitting regions 158, 160, 162, 164, 166. Regions of the light emitting diode 150, such as regions 168, 170, 172, 174, 176, 178 comprise non-emitting regions that include electrical conductor and that do not generate light as a result of the electrical power. The non-emitting regions, however, can provide light by reflection, excitation of phosphors, or both. The image of the light emitting diode 150 is thus a pattern of regions that emit light and regions that do not emit light. For use in projection, an image is desired that is relatively uniform in brightness such as illustrated in FIG. 1D. As described above in connection with FIGS. 1A, 1B, a curved polarizing filter 130 or a tilted polarizing filter 131 is included in a light engine. The curved, non-orthogonal polarizing filter 130 provides light that most efficiently re-images the reflected light to the LED regions for recycling. The non-orthogonal polarizing filter 130 (or 131), reflects recycled light back to a portion of the light source front surface 106 that is different than the portion of the light source front surface from which the light originated. The non-orthogonal polarizing filter slightly shifts the recycled image to fill in darker regions of the light source front surface 106. The resulting polarized light engine image is more uniform because of the non-orthogonal recycling polarizing filter 130 or 131. The tilted polarizing filter 131 improves centering of the recycled image 140, 142 onto the light emitting diode 150. A curved polarizing filter 130 can also be tilted. The image that emanates from the light recycling polarization filter that is tilted and curved is a uniform, centered image as illustrated at 180 in FIG. 1D.

FIG. 14 illustrates a light emitting diode 1400 as an alternative embodiment that serves as a light source. The light emitting diode 1400 includes regions that emit different wavelengths of light in regions 1402, 1404, and 1406, where these regions can, for example, can emit red, green, and blue light, respectively. A region 1408 can emit additional green light, or a fourth color of light. The region 1408 can alternatively comprise a mirror. These are examples of many possible configurations of a source that emits different wavelengths in distinct regions. The light emitting diode 1400 can, for example, generate blue and yellow light in different regions, and may include combinations of red, yellow, green, cyan, blue, magenta, and white regions, with equal or non-equal numbers of each color emitting regions. The area of each region may be equal, or different than adjacent regions, or be a combination of different sized regions.

The different color emitting regions may be constructed out of discrete light emitting diodes or may be constructed from a single light emitting diode with at least one emitting surface of the light emitting diode covered with a pattern of transparent and wavelength converting regions. For example, portions of the emitting surface of a single light emitting diode that emits blue light may be covered with a wavelength conversion layer that coverts blue light to red or green light, or a combination thereof. The light emitting diode 1400 may also be constructed from a combination of discrete and multi-wavelength single light emitting diodes. The light emitting diode 1400 may have at least two emitting regions, preferably at least 3 emitting regions. In other embodiments of the invention, light emitting diode 1400 may have tens, hundreds, or thousands of light emitting regions.

Suitable materials for wavelength conversion include phosphors, including for example, Ce:YAG, sulfides, thiogallates, silicates, quantum dots, organic fluorescent materials such as fluorescent dyes and pigments, and semiconductors such as III-V and II-VI materials, and doped semiconductors, and combinations thereof.

Light that is recycled by the combination of the reflective polarizer with the illumination optics used for collecting the light from the light emitting diode 1400 may preferentially by recycled back to the originating region, or may be recycled to a different region. The different region may or may not emit the same color of light from the recycled light. Preferably, the light emitting diode will have a low absorptivity for the recycled light.

Figure 2B:
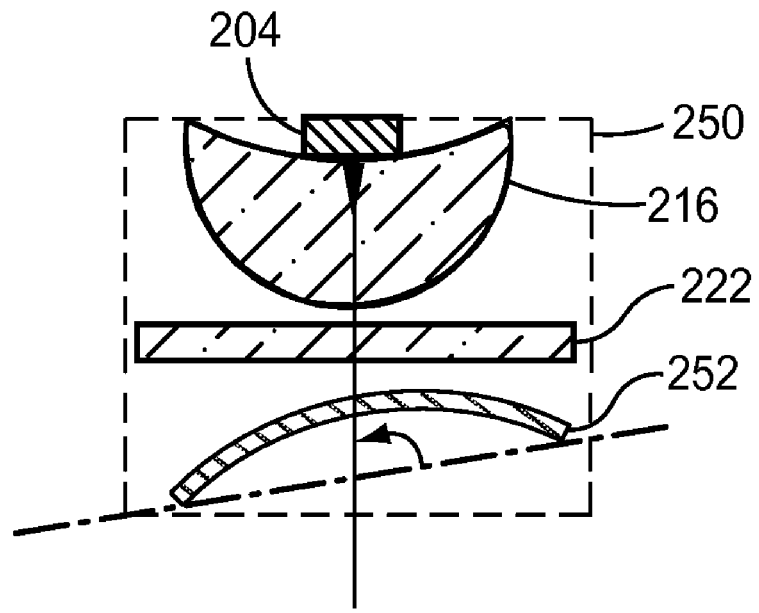
FIG. 2B illustrates a portion of a light engine that includes a tilted, curved polarizing filter.

FIG. 2A illustrates a light engine 200 that is part of a projector 203. The light engine 200 provides a polarized light engine image 202. The image 202 is collimated. The polarized light image 202 provides polarized illumination in the projector 203, which utilizes an LCOS image device 201 that has pixels that selectively reflect polarized light.

The light engine 200 comprises a light source 204. As illustrated for example in FIG. 1C, a light source 150 has a front surface (comparable to front surface 206 in light engine 200 of FIG. 2A) that includes regions 158, 160, 162, 164, 166 that emit non-collimated light (such as light 208) and non-emitting regions 168, 170, 176, 178 that recycle light. The emitting regions 158, 160, 162, 164, 166 can also recycle light. According to one aspect, the regions 158, 160, 162, 164, 166 comprise an array of light emitting diodes. According to another aspect, the array of light emitting diodes emit white light. According to another aspect, the array of light emitting diodes sequentially emit red, green and blue light.

According to one aspect, the emitting regions, the non-emitting regions or both regions can comprise a phosphor for light recycling. According to another aspect, the emitting regions, the non-emitting regions or both regions can comprise reflective surfaces.

The light engine 200 comprises a collection lens 216. The collection lens 216 collects the non-collimated light 208 and provides incompletely collimated light 218 of the front surface 206. According to one aspect, the collection lens 216 comprises a ball lens. According to another aspect, the collection lens 216 comprises a high index of refraction hyper-hemispheric ball lens.

The light engine 200 comprises a collimating lens 222. The collimating lens 222 receives the incompletely collimated light 218 and provides a collimated image 224 of the front surface 206. According to one aspect, the collimating lens 222 comprises at least one Fresnel lens. According to another aspect, the collimating lens 222 comprises at least one convex lens. According to one aspect, the light engine image 202 has substantially the same size as the collimated image 224. According to another aspect, the light engine image 202 comprises a collimated image.

The light engine 200 comprises a polarizing filter 230. The polarizing filter receives the collimated image 224 of the front surface 206. The polarizing filter 230 passes a polarized portion 232 of the collimated image 224 as a direct component of the polarized light engine image 202. The polarizing filter 230 reflects a recycled image 240 back to the front surface 206. The front surface 206 provides the recycled image 240 as a recycled component of the polarized light engine output 202. The front surface 206 can provide the recycled image by reflection, phosphor excitation, or both. According to one aspect, the polarizing filter 230 comprises multilayer optical polarizing film.

Figure 2C:
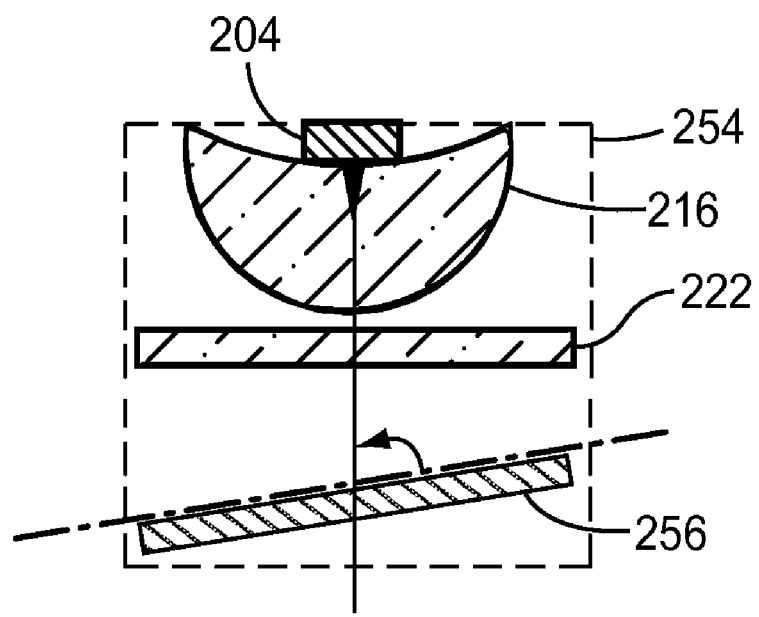
FIG. 2C illustrates a portion of a light engine that includes a tilted polarizing filter.

The polarizing filter 230 comprises a curved filter shape having a curvature that transversely shifts portions of the recycled component relative to the direct component, to increase brightness uniformity of the polarized light engine image 202. According to one aspect, the curvature is adjusted to correct for aberration in the collection lens and collimating lens. According to another aspect, the curved filter shape comprises a convex face 236 that faces the collimating lens 222. The curvature of the polarizing filter can be on axis or off axis depending on the pattern of brightness of the light emitting diode. According to another aspect shown in FIG. 2B, a polarizing filter 252 can be both curved and tipped. According to another aspect, the first region includes a light emitting diode that emits a pattern of optical brightness that is off-center relative to a light emitting diode center (see FIG. 1C), and a polarizing filter 256 is tilted as shown in FIG. 2C to improve centering of the recycled image 240 onto the front surface 206.

According to one aspect, the polarized light engine image 200 comprises an image of the front surface 206 in which the second regions of the image 202 have been filled by recycled light. According to another aspect, the light engine 200 does not include a light tunnel. According to another aspect, the recycled image 240 comprises an autocollimated image relative to the front surface 206. According to another aspect, the light source 204 and the collection lens 216 are portions of a light emitting diode compound encapsulant lens.

Although the present invention has been described with reference to preferred embodiments, workers skilled in the art will recognize that changes may be made in form and detail without departing from the spirit and scope of the invention.

What is claimed is:

1. A light engine that provides a polarized light engine image, comprising:
    a light source that has a front surface comprising a first region and a second region;
    a collection lens that collects the non-collimated light from the front surface and that provides incompletely collimated light from the front surface;
    a collimating lens that receives the incompletely collimated light and that provides a substantially collimated image of the front surface;
    a polarizing filter that receives the collimated image of the front surface, the polarizing filter passing a polarized portion of the collimated image as a direct component of the polarized light engine image, and the polarizing filter reflecting a recycled image back to the front surface, the front surface providing the recycled image as a recycled component of the polarized light engine image; and
    the polarizing filter comprising a non-orthogonal shape that shifts portions of the recycled component relative to the direct component, to increase brightness uniformity of the polarized light engine image.

2. The light engine of claim 1 wherein the non-orthogonal shape of the polarizing filter is selected from the group of a tilted polarizing filter shape and a curved polarizing filter shape.

3. The light engine of claim 1 wherein the filter shape comprises a curved, convex face that faces the collimating lens.

4. The light engine of claim 1 wherein the first region comprises an array of light emitting diodes.

5. The light engine of claim 4 wherein the array of light emitting diodes emit white light.

6. The light engine of claim 4 wherein the array of light emitting diodes sequentially emit red, green and blue light.

7. The light engine of claim 1 wherein the collection lens and the light source are combined in an encapsulated light emitting diode ball lens.

8. The light engine of claim 1 wherein the collimating lens comprises at least one Fresnel lens.

9. The light engine of claim 1 wherein the collimating lens comprises at least one convex lens.

10. The light engine of claim 1 wherein the first region includes a light emitting diode that emits a pattern of optical brightness that is off-center relative to a light emitting diode center, and the non-orthogonal polarizing filter improves centering of the polarized light engine image.

11. The light engine of claim 1 wherein at least one of the first and second regions comprises a phosphor.

12. The light engine of claim 1 wherein the second region comprises a reflective surface.

13. The light engine of claim 1 wherein the light engine image has substantially the same size as the collimated image.

14. The light engine of claim 1 wherein the light engine image comprises a collimated image.

15. The light engine of claim 1 and further comprising a quarter wave plate disposed between the light source and the polarizing filter.

16. The light engine of claim 1 wherein the substantially collimated image of the front surface comprises recycled light.

17. The light engine of claim 1 wherein the light engine does not include a light tunnel.

18. The light engine of claim 1 wherein the recycled image comprises an autocollimated image relative to the front surface.

19. The light engine of claim 1 wherein the collection lens, the collimating lens, the polarizing filter, and the polarized light engine image are aligned along a common optical axis.

20. The light engine of claim 1 wherein the polarizing filter comprises multilayer optical polarizing film.

21. The light engine of claim 1 wherein the light source and the collection lens are portions of a light emitting diode compound encapsulant lens.

22. A light engine that provides a polarized light engine image, comprising:
   a light source that emits non-collimated light;
   a collection lens that collects the non-collimated light and that provides incompletely collimated light of the front surface;
   a collimating lens that receives the incompletely collimated light and that provides a collimated image of the front surface;
   a non-orthogonal polarizing filter that receives the collimated image of the front surface, the polarizing filter passing a polarized portion of the collimated image as a direct component of the polarized light engine image, and the polarizing filter reflecting a recycled image back to the front surface; the front surface providing the recycled image as a recycled component of the polarized light engine output; and
   a quarter wave plate between the polarizing filter and the light source.

* * * * *